US010185225B2

(12) United States Patent
Egashira

(10) Patent No.: US 10,185,225 B2
(45) Date of Patent: Jan. 22, 2019

(54) LITHOGRAPHY APPARATUS AND ARTICLE MANUFACTURING METHOD

(71) Applicant: CANON KABUSHIKI KAISHA, Tokyo (JP)

(72) Inventor: Shinichi Egashira, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/783,348

(22) Filed: Oct. 13, 2017

(65) Prior Publication Data

US 2018/0107125 A1 Apr. 19, 2018

(30) Foreign Application Priority Data

Oct. 19, 2016 (JP) .................. 2016-205470

(51) Int. Cl.
G03B 27/52 (2006.01)
G03F 7/20 (2006.01)
G03F 9/00 (2006.01)

(52) U.S. Cl.
CPC ........ G03F 7/70641 (2013.01); G03F 9/7026 (2013.01)

(58) Field of Classification Search
CPC ......... G03F 7/20; G03F 9/7023; G03F 9/7076
USPC ........................................ 355/52, 53, 55, 67
See application file for complete search history.

(56) References Cited

U.S. PATENT DOCUMENTS

| 8,472,009 B2 | 6/2013 | Takenaka |
| 8,619,177 B2 | 12/2013 | Perwass et al. |
| 8,625,074 B2 * | 1/2014 | Matsumoto ............ G03B 27/42 355/55 |
| 2006/0250598 A1 * | 11/2006 | Sasaki ................. G03F 7/70341 355/55 |
| 2008/0292177 A1 * | 11/2008 | Sheets ................... G03F 9/7084 382/151 |
| 2009/0103067 A1 * | 4/2009 | Takenaka ............... G03B 27/42 355/53 |

FOREIGN PATENT DOCUMENTS

| JP | 2008103432 A | 5/2008 |
| JP | 2011060919 A | 3/2011 |
| JP | 5411350 B2 | 2/2014 |
| WO | 2010121637 A1 | 10/2010 |

* cited by examiner

Primary Examiner — Hung Henry Nguyen
(74) Attorney, Agent, or Firm — Rossi, Kimms & McDowell LLP

(57) ABSTRACT

A lithography apparatus includes a detector that detects an original-side mark image and a substrate-side mark image via a projection optical system, and a controller. The detector generates refocusable light field image data that includes the original-side mark image and the substrate-side mark image. The controller performs, based on the light field image data obtained from the detector, a refocus operation of reconstructing a plurality of images different in position in a focus direction and adjusts a position of at least one of the original holder and the substrate holder based on the plurality of images reconstructed by the refocus operation.

14 Claims, 18 Drawing Sheets

F I G. 14
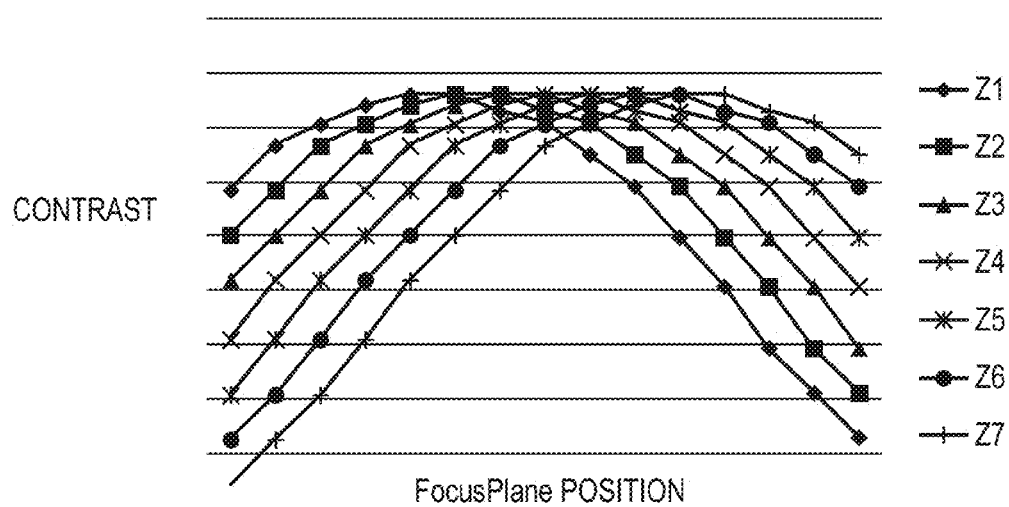
F I G. 15
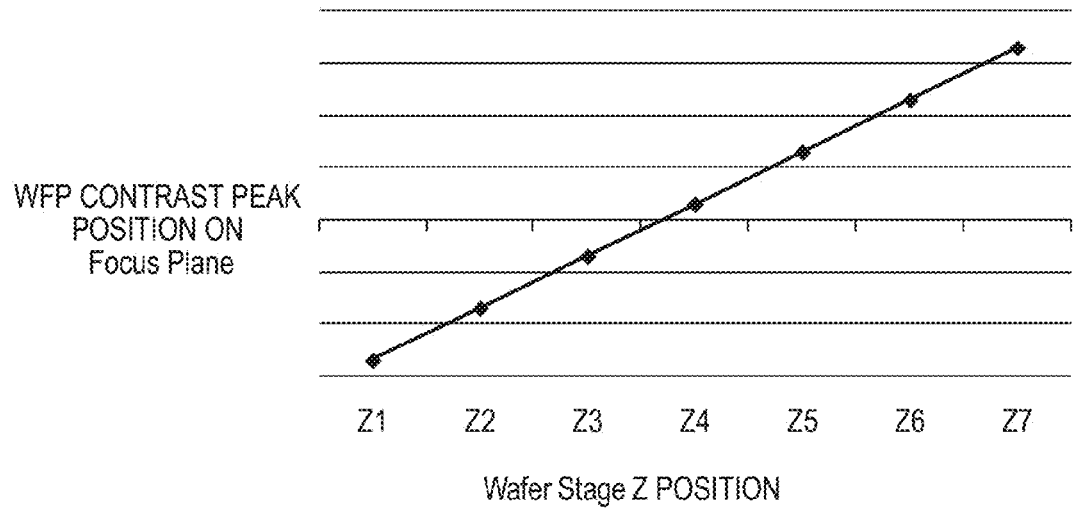

WFP CONTRAST PEAK POSITION RESIDUE ON Focus Plane

Wafer Stage Z POSITION

RFP CONTRAST PEAK POSITION ON Focus Plane

FOCUS LENS POSITION

RFP CONTRAST PEAK POSITION RESIDUE ON Focus Plane

FOCUS LENS POSITION

LITHOGRAPHY APPARATUS AND ARTICLE MANUFACTURING METHOD

BACKGROUND OF THE INVENTION

Field of the Invention

The present invention relates to a lithography apparatus and an article manufacturing method.

Description of the Related Art

In a lithography apparatus such as a semiconductor exposure apparatus, a focus position of a projection optical system may vary due to, for example, a variation in heat generated by exposure light, an atmospheric pressure, an environmental temperature, or the like. It is therefore necessary to calibrate a best focus position periodically before a substrate is exposed. In general, an influence by the above-described variation factor is predicted in advance, and the best focus position is calibrated. For more accurate calibration, however, the best focus position of the projection optical system needs to be measured actually and be calibrated. Conventionally, the best focus position of a projection optical system has been calibrated by measuring a reference mark on an original stage and a reference mark on a substrate stage by a technique such as a TTL (Through The Lens) method (see In a conventional technique, however, the height position (a position in a Z direction) of the substrate stage needs to be driven actually to measure the best focus position, resulting in a long measurement time. Moreover, measurement accuracy decreases easily if a driving speed is increased under the influence of a vibration caused by driving, making it difficult to shorten the measurement time by increasing the speed of driving. Note that as a focus alignment technique that does not need driving, for example, a general phase difference AF method by a digital camera or the like is considered. However, a spatial resolution in a focal direction is low with this method, making it impossible to achieve a required measurement accuracy.

SUMMARY OF THE INVENTION

The present invention provides a technique advantageous in increasing a speed in calibrating the best focus position of a projection optical system.

According to one aspect of the present invention, a lithography apparatus which includes a projection optical system that projects a pattern of an original on a substrate is provided. The apparatus comprises an original holder that holds the original, a substrate holder that holds the substrate, a detector that detects an original-side mark image arranged in one of the original and the original holder, and a substrate-side mark image arranged in one of the substrate and the substrate holder via the projection optical system; and, a controller, wherein the detector generates refocusable light field image data that includes the original-side mark image and the substrate-side mark image, and the controller performs, based on the light field image data obtained from the detector, a refocus operation of reconstructing a plurality of images different in position in a focus direction, and adjusts a position of at least one of the original holder and the substrate holder based on the plurality of images reconstructed by the refocus operation.

Further features of the present invention will become apparent from the following description of exemplary embodiments (with reference to the attached drawings).

BRIEF DESCRIPTION OF THE DRAWINGS

FIG. 14 is a graph showing the contrast curve of the image of the WFP mark for each WSZ position;

FIG. 15 is a graph showing the relationship between the WSZ positions and the peak positions on the contrast curve of the image of the WFP mark;

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the following embodiments are not intended to limit the present invention and are merely concrete example embodiments of the invention. Also, not all combinations of features to be described in the following embodiments are indispensable for the means to solve the problems according to the present invention.

<First Embodiment>

Figure 1:
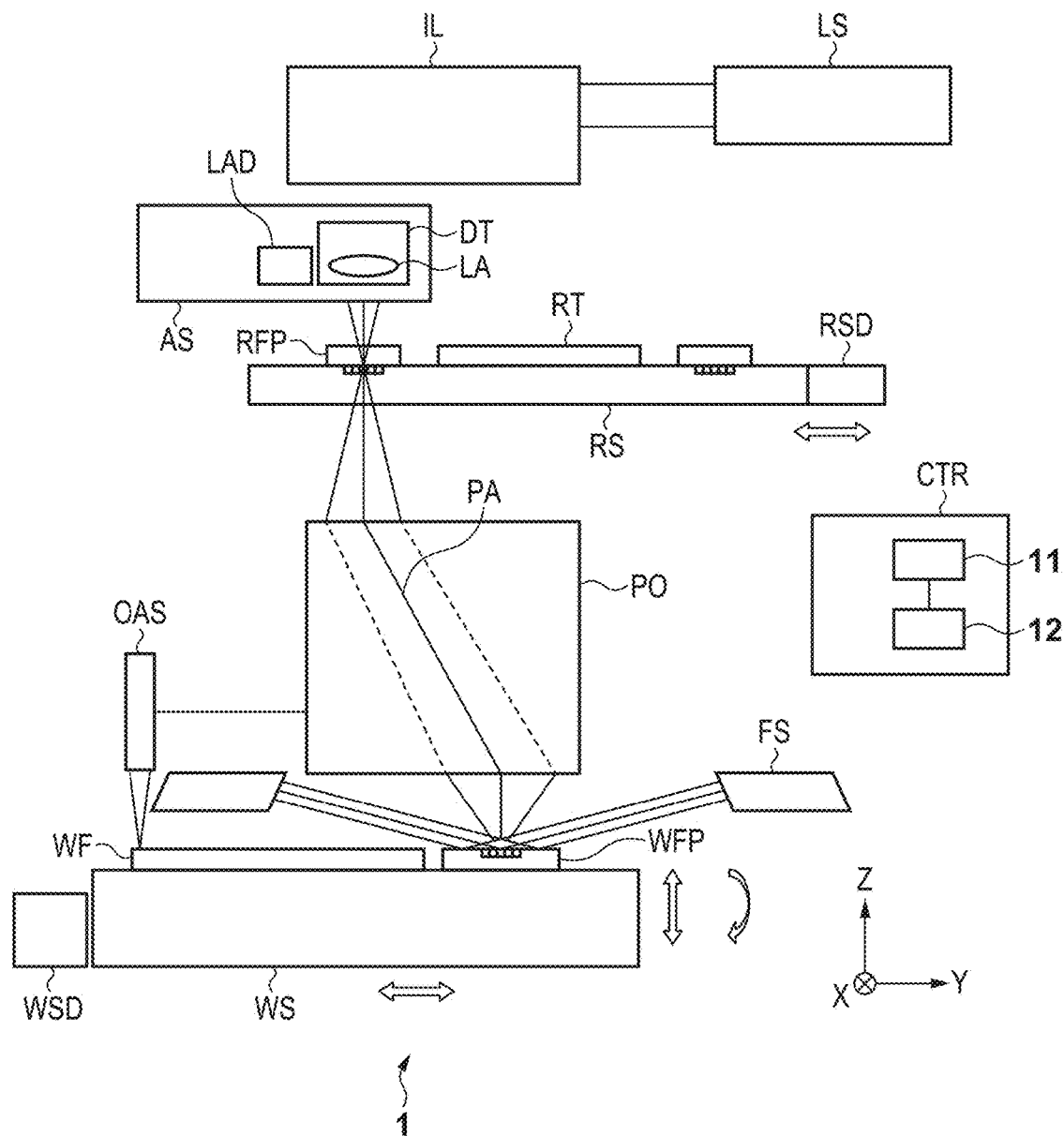
FIG. 1 is a view showing the arrangement of an exposure apparatus according to an embodiment.

In an embodiment below, an exposure apparatus which exposes a photosensitive substrate via an original and projection optical system will be described as an example of a lithography apparatus. FIG. 1 is a view showing the arrangement of an exposure apparatus 1 according to this embodiment. The exposure apparatus 1 includes an illumination optical system IL, a reticle stage RS serving as an original holder that holds a reticle RT as an original, a projection optical system PO, and a wafer stage WS serving as a substrate holder that holds a wafer WF as a substrate. The exposure apparatus 1 can also include a calibration measurement system AS, an alignment detecting system OAS, a focus detecting system FS, and a controller CTR. The controller CTR generally controls the respective units of the exposure apparatus 1.

The controller CTR can include, for example, a CPU 11 and a memory 12. The memory 12 stores control programs and various data executed by the CPU 11. The controller CTR can be implemented by, for example, a control board or the like that mounts a multicore CPU, a GPU, or an FPGA. However, the arrangement of the control board is not limited to this.

An exposure light source LS, the illumination optical system IL, the reticle stage RS, the projection optical system PO, and the wafer stage WS are arranged centering on an optical axis PA. The optical axis PA is an axis that indicates a direction in which the principal rays of exposure light travel from the exposure light source LS to the wafer stage WS. For example, a mercury lamp, a KRF excimer laser or ARF excimer laser as extreme ultraviolet light, or the like can be used for the exposure light source LS. A beam emitted from the exposure light source LS illuminates a predetermined region of the reticle RT via the illumination optical system IL. The pattern of a fine circuit to be transferred is formed in the reticle RT. The reticle stage RS holds the reticle RT. The controller CTR controls driving of a driver RSD which drives the reticle stage RS. The driver RSD drives the reticle stage RS in a state in which a height position (a position in a Z direction) is kept constant with respect to the projection optical system PO.

The wafer WF is arranged at a position almost optically conjugate to the reticle RT via the projection optical system OP. The wafer stage WS holds the wafer WF. A laser interferometer (not shown) and the controller CTR control driving of a driver WSD which drives the wafer stage WS in the direction (Z direction) of the optical axis PA of the projection optical system PO and in the direction of a plane (X-Y plane) perpendicular to the direction of the optical axis PA. They further control driving of the driver WSD in a direction (θ direction) that rotates about the optical axis PA and a direction (tilt direction) that tilts to a plane perpendicular to the optical axis PA. That is, the laser interferometer (not shown) and the controller CTR control driving of the driver WSD. A moving mirror which reflects a beam from the laser interferometer is fixed to the wafer stage WS. The laser interferometer sequentially measures the position and moving amount of the wafer stage WS via the moving mirror. The controller CTR receives, from the laser interferometer, information on the position and moving amount of the wafer stage WS, and drives the wafer stage WS via the WS driver WSD.

At the time of exposure, the wafer stage WS is driven to an exposure position with respect to the optical axis PA. Consequently, light incident on the reticle RT is diffracted by that pattern and is formed into an image as an exposure pattern on the wafer WF via the projection optical system PO. A latent pattern is thus formed on the wafer WF.

A resolving power close to a limit is required of the projection optical system PO. Therefore, the projection optical system PO includes a measuring unit (not shown) that measures a factor (for example, an atmospheric pressure, an environmental temperature, or the like) influencing the resolving power and a mechanism (an auto focus mechanism which is not shown) that corrects the imaging characteristic of a lens of the projection optical system PO. The controller CTR receives a measurement value as the factor for influencing the resolving power from the measuring unit and based on the measurement value, controls the auto focus mechanism to correct the imaging characteristic of the lens of the projection optical system PO.

An operation when the focus detecting system FS detects the Z position and leveling (tilt) of the wafer WF will now be described. The focus detecting system FS includes a light projecting system and a light receiving system, and detects the height position (the position in the Z direction) of the wafer WF by an oblique incidence method. The light projecting system of the focus detecting system FS performs irradiation with light (slit image) in an oblique direction with respect to the optical axis of the projection optical system. The light receiving system of the focus detecting system FS detects reflected light (slit image) reflected by the surface of the wafer WF (or the surface of a wafer-side reference plate WFP). The light receiving system of the focus detecting system FS includes a light receiving device for detecting a Z position corresponding to the reflected light, and the light receiving surface of the light receiving device and a reflection point on the surface of the wafer WF are arranged to be almost conjugate to each other. Therefore, the positional shift of the wafer WF (or the wafer-side reference plate WFP) in the Z direction is detected as the image forming positional shift of the slit image in the light receiving device. Consequently, the focus detecting system FS performs focus measurement and obtains a focus measurement value. The light projecting system of the focus detecting system FS irradiates the surface of the wafer WF (or the surface of the wafer-side reference plate WFP) with a plurality of light beams (slit images) in order to detect leveling (tilt). The light receiving system of the focus detecting system FS includes a plurality of light receiving devices corresponding to them. The light receiving surface of each light receiving device and each reflection point on the surface of the wafer WF are arranged to be almost conjugate to each other. By doing so, positions on the light receiving surfaces of a plurality of slit images are detected, detecting the tilt of the wafer WF (or the wafer-side reference plate WFP).

If there is a shift between the origin of the focus detecting system FS and the best focus position (an image forming position in a vertical direction) of the projection optical system PO, it may become difficult to match the surface of the wafer WF with the best focus position based on the focus measurement value. To cope with this, in order to calibrate the origin of the focus detecting system FS, a calibration measurement system AS of a TTL (Through The Lens) method is provided. The calibration measurement system AS includes a reticle-side reference plate RFP, the wafer-side reference plate WFP, and a light detector DT. The light detector DT is arranged at a position facing the projection optical system PO via the reticle stage RS. The light detector DT can include a camera and a TTL observation microscope using light (observation light source) having the same wavelength as an exposure wavelength. On the wafer-side reference plate WFP, a wafer-side reference mark (not shown) is formed as a reflective (for example, three-dimensional) pattern. With these, the light detector DT illuminates the reticle-side reference plate RFP and the wafer-side reference mark via the projection optical system PO by epi-illumination, and detects reflected light as an image by the camera in the light detector DT. While calculating the contrast of an image of a mark from the detected image, the best focus position having the maximum contrast, that is, the best focus position of the projection optical system PO is measured. Consequently, the origin of the focus detecting system FS is calibrated to the best focus position of the projection optical system PO.

Figure 2:
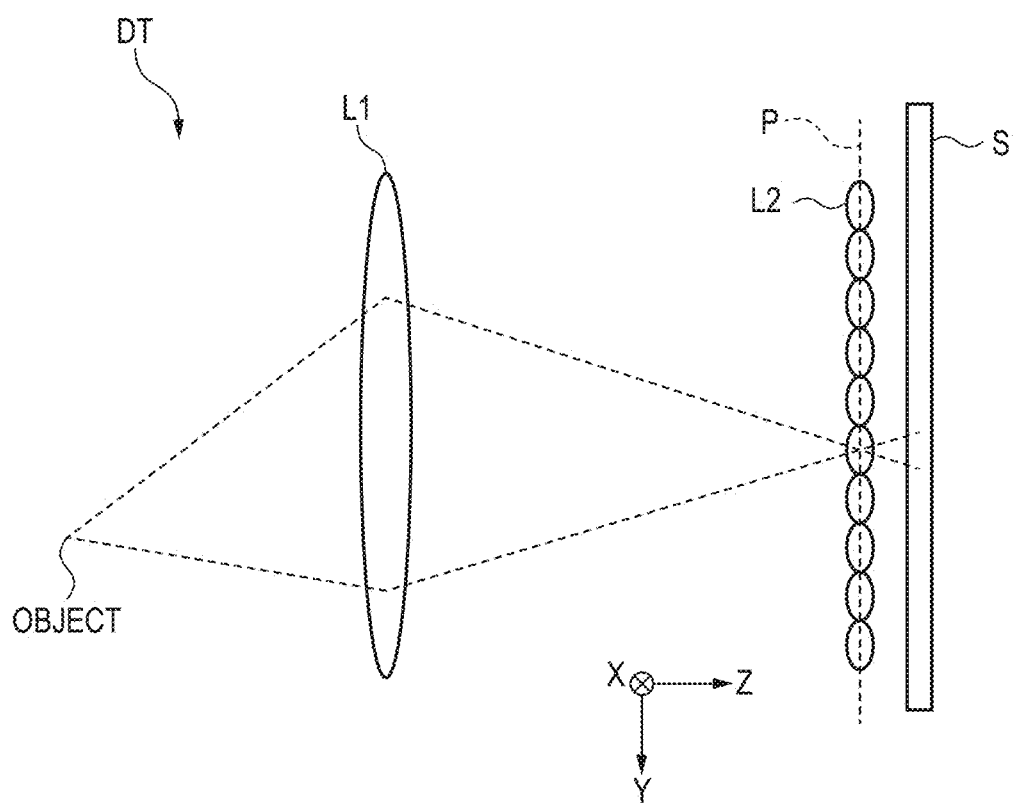
FIG. 2 is a view showing the arrangement of a light detector according to the embodiment.

In this embodiment, the light detector DT of the calibration measurement system AS can include a light field camera. The light field camera is also referred to as a Plenoptic camera. As shown in FIG. 2, the light field camera captures light that has passed through a micro lens array L2 arranged on an imaging plane P of a shooting lens L1 (main lens) on the front side of an image sensor 21. This allows the light field camera to reconstruct (refocus), by calculation processing, a two-dimensional image on different focal planes of an object. A unifocal and multifocal micro lens arrays exist. For example, Japanese Patent No. 5411350 describes an example or the like in which a multifocal Plenoptic optical system improves the spatial resolution of a reconstructed image. Here, a plane (focal plane) at a certain position in a focus direction (an optical axis direction or Z direction of the light detector DT) for performing reconstruction by the light field camera will be referred to as a focus plane (FP), and a reconstructed two-dimensional image will be referred to as an FP image. In this embodiment, the optical axis direction of the light detector DT is a direction (that is, the Z direction (first direction)) parallel to the optical axis of the projection optical system. The calibration measurement system AS includes a focus lens LA which adjusts a focus by moving in the Z direction (the optical axis direction of the light detector DT). Note that the shooting lens L1 (FIG. 2) in the light field camera may include the focus lens LA. The controller CTR can control driving of the focus lens LA via a focus lens driver LAD.

In a description below, in order to explain a method of measuring the best focus position from the FP image, a measurement method of a step driving method as a conventional technique will be described first and in contrast with it, a measurement method according to this embodiment will be described.

Figure 3:
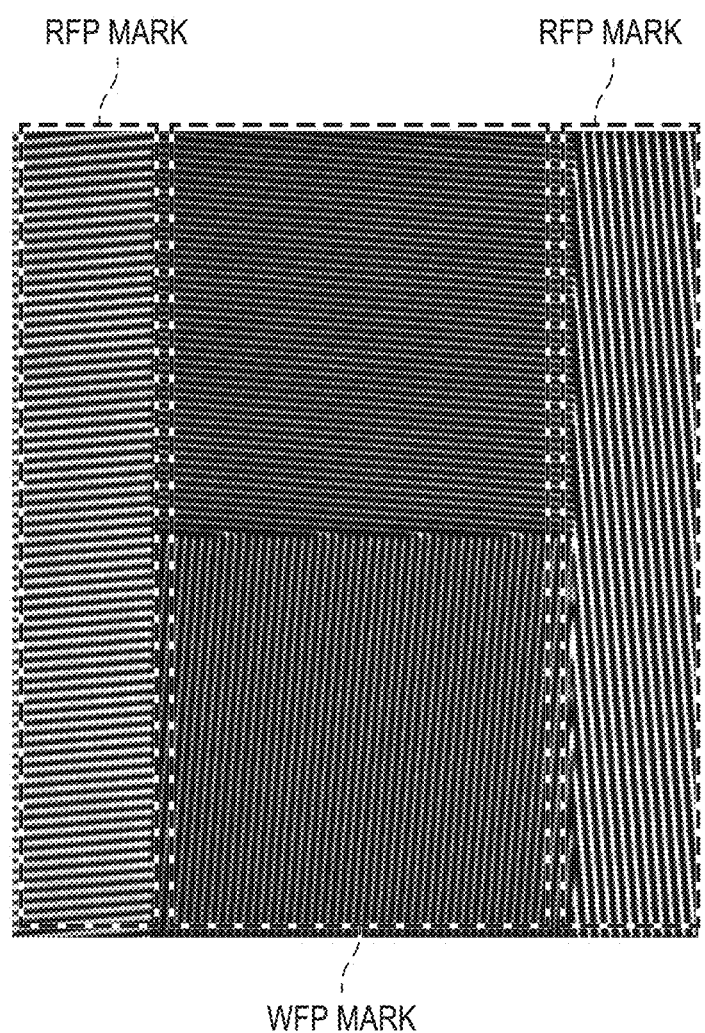
FIG. 3 is a view exemplifying images of RFP marks and a WFP mark according to the embodiment.

In the step driving method, the calibration measurement system AS captures, through the same field, a reticle reference mark (original-side mark) (to be referred to as a "RFP mark" hereinafter) on the reticle-side reference plate RFP and a wafer reference mark (substrate-side mark) (to be referred to as a "WFP mark" hereinafter) on the wafer-side reference plate WFP, obtaining a two-dimensional image. The RFP mark and the WFP mark are arranged to be almost conjugate to each other via the projection optical system PO. The RFP mark is partially made of blank glass, making it possible to observe the WFP mark in a blank glass portion via the projection optical system PO. FIG. 3 shows an example of the two-dimensional image captured by the calibration measurement system AS.

Figure 4:
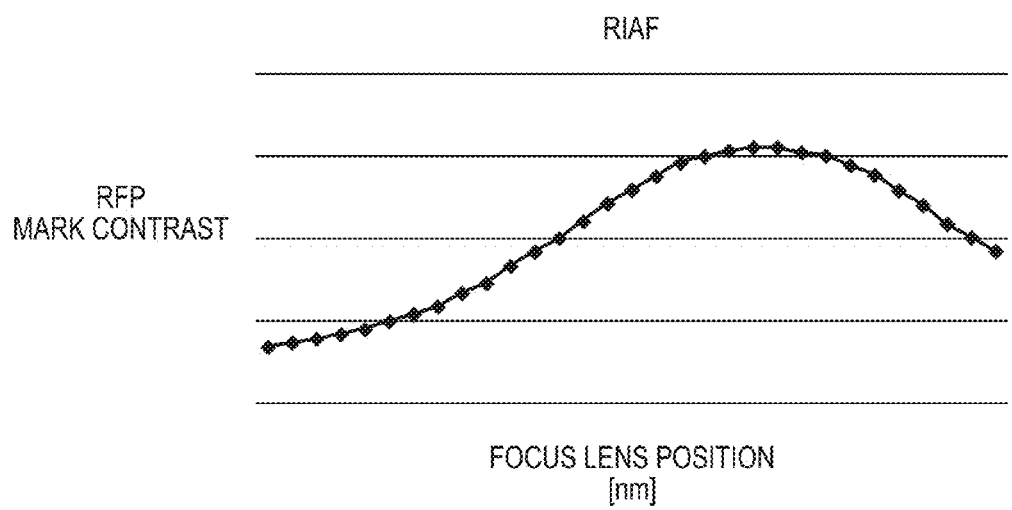
FIG. 4 is a graph exemplifying the relationship between a focus lens position and a contrast value of the RFP mark calculated by a step driving method.

In order to measure the best focus position of the RFP mark, an RFP mark image is obtained while changing the position of the focus lens LA in the calibration measurement system AS. Then, a contrast value of an image of the RFP mark is calculated from each image at a corresponding one of focus lens positions. The relationship between this focus lens position and the contrast values of the images of the RFP marks is represented by a contrast curve of a reticle image auto focus (RIAF). FIG. 4 shows an example of the contrast curve of the RIAF. A focus lens position to be the peak of this RIAF contrast curve is calculated. Each contrast value on the contrast curve can be calculated using a general definitional equation of an image contrast. If a mark image defocuses, the contrast value decreases. That is, the contrast reaches its peak at the best focus position. The focus lens position that brings the RFP mark into best focus is determined by the RIAF contrast curve.

Figure 5:
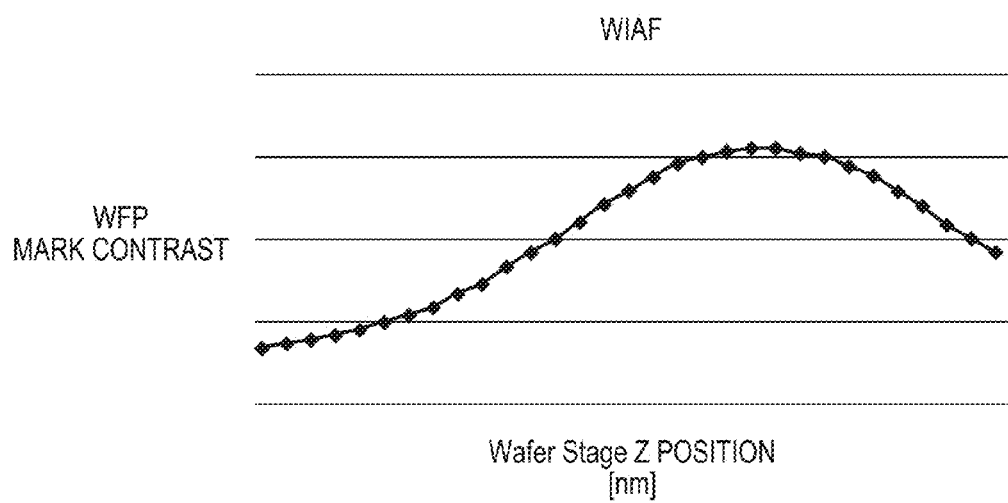
FIG. 5 is a graph exemplifying the relationship between the Z position of a wafer stage and a contrast value of the WFP mark calculated by the step driving method.

Next, the contrast peak of an image of the WFP mark is measured in a state in which the focus lens position is fixed to the above-described position. More specifically, WFP mark image is obtained while changing a Z position of the wafer stage WS (to be referred to as a "WSZ position" hereinafter). Then, a contrast value of the image of the WFP mark is calculated from each WFP mark image at a corresponding one of the WSZ positions. The relationship between this WSZ position and the contrast value of the image of the WFP mark is represented by a contrast curve of a wafer image auto focus (WIAF). FIG. 5 shows an example of the contrast curve of the WIAF. As in RIAF measurement, the WSZ position to be a peak is calculated from this WIAF contrast curve.

With the above-described step driving method, it is possible to obtain a WSZ position that brings the WFP mark into best focus when the best focus position of the RFP mark is used as a reference.

Figure 6:
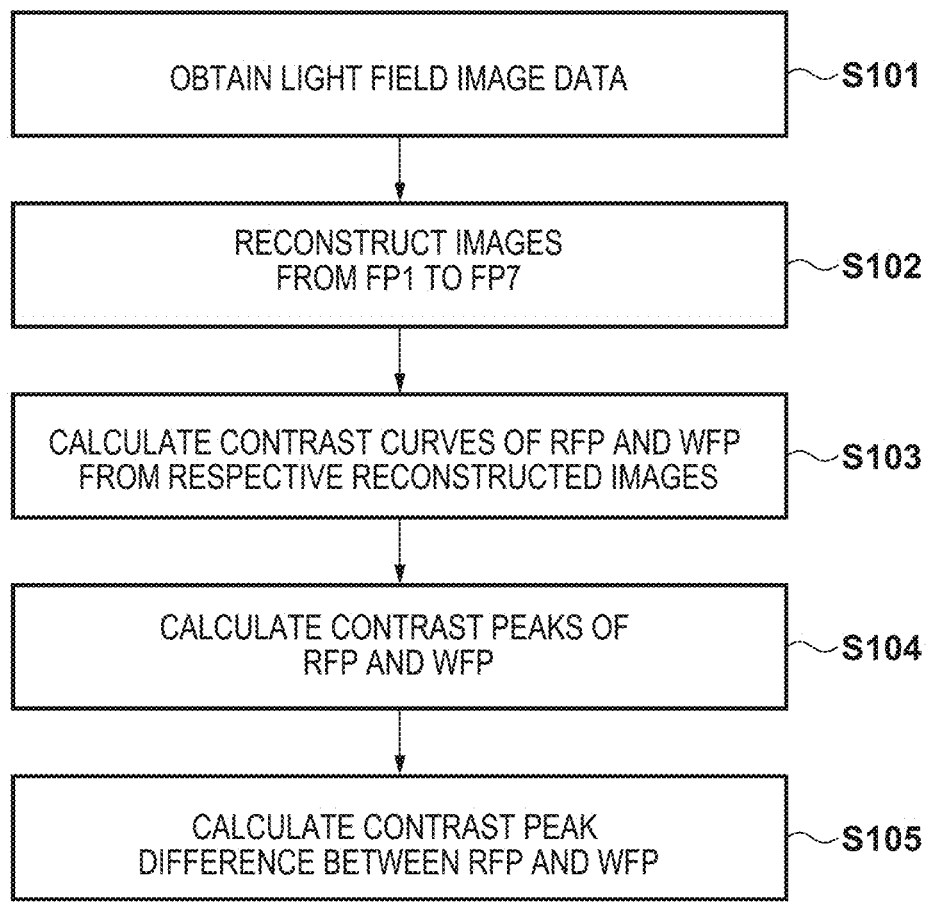
FIG. 6 is a flowchart showing best focus calibration processing of a projection optical system according to the embodiment.

The processing sequence of best focus measurement using the light field camera according to this embodiment will now be described with reference to a flowchart of FIG. 6. This processing sequence is performed by the controller CTR. More specifically, a program corresponding to the flowchart of FIG. 6 is stored in the memory 12 and executed by the CPU 11.

Figure 7:
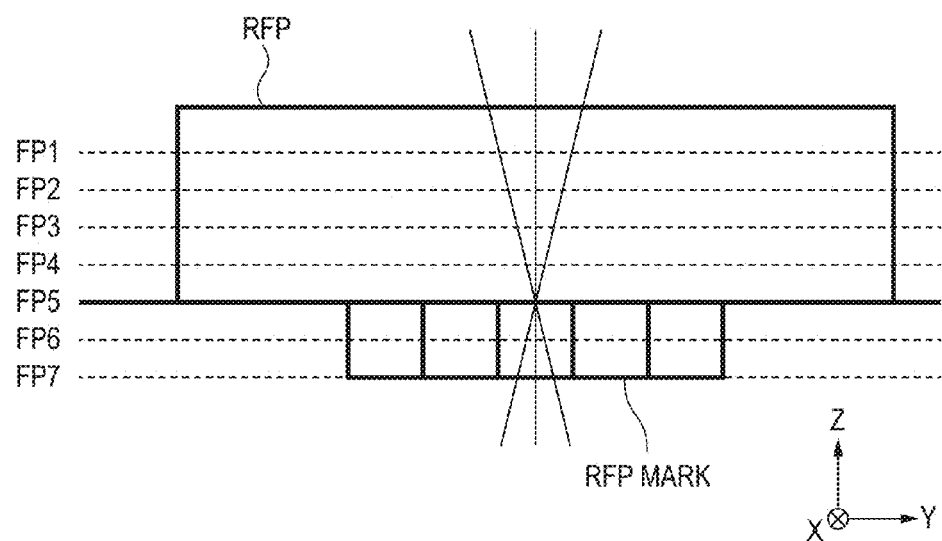
FIG. 7 is a view showing the relationship between the RFP mark and the respective focus planes FPs of a light field camera.

In step S101, the light detector DT that forms the light field camera captures an RFP mark and a WFP mark at an initial focus lens position and an initial WSZ position under the control of the controller CTR. The controller CTR obtains, from the light detector DT, light field image data (to be referred to as "original image data" hereinafter) generated by image capturing. In step S102, the controller CTR performs a refocus operation using the obtained original image data. That is, from the obtained original image data, the controller CTR reconstructs, by calculation processing, FP images of the RFP mark at respective focus plane positions FP1 to FP7 corresponding to Z positions different from each other in the focus direction (the optical axis direction or Z direction of the light detector DT). FIG. 7 shows the positional relationship between the RFP mark and FP1 to FP7.

Figure 8:
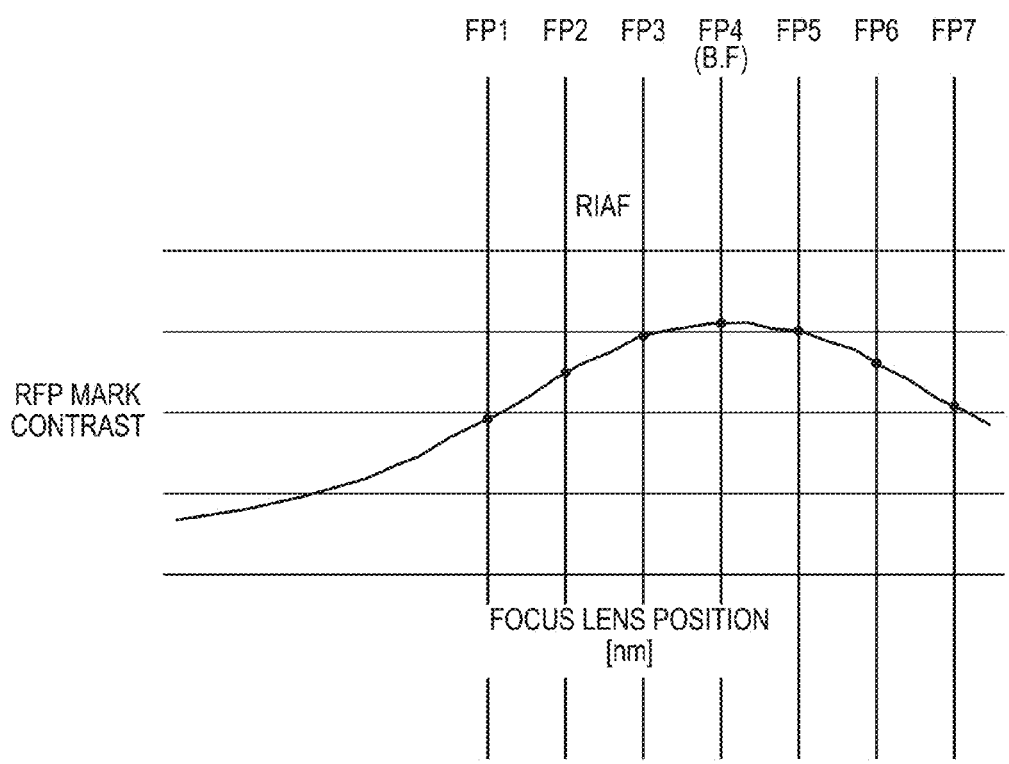
FIG. 8 is a graph exemplifying the relationship between the respective focus planes FPs of the light field camera and the contrast value of the RFP mark.

In step S103, the controller CTR calculates the contrast value of the image of the RFP mark and the contrast value of the image of the WFP mark from the respective FP images of the focus planes FP1 to FP7. Consequently, the RIAF contrast curve, as shown in FIG. 8, with respect to the respective FP positions near the RFP mark corresponding to that shown in FIG. 4 obtained when the focus lens position is changed by the step driving method is obtained.

Figure 9:
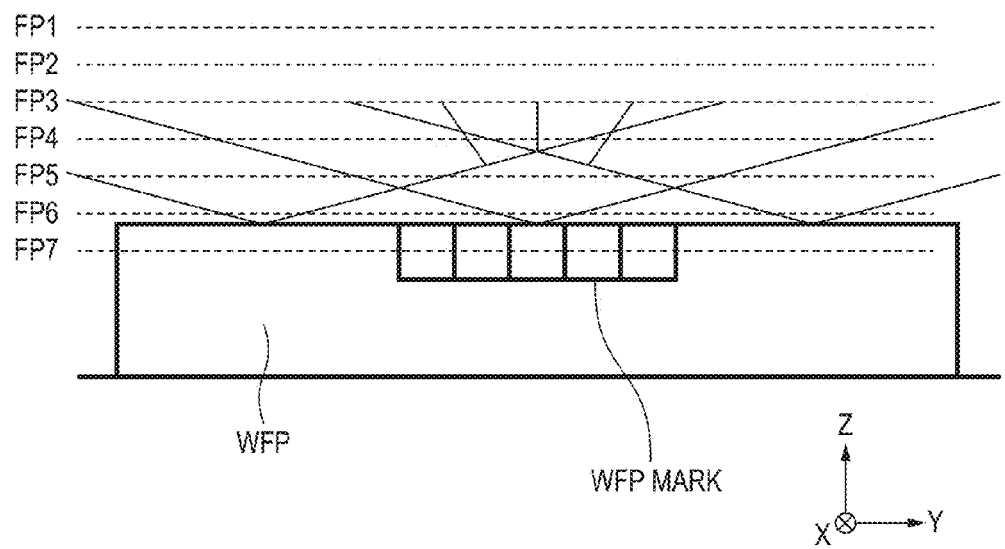
FIG. 9 is a view showing the relationship between the WFP mark and the respective focus planes FPs of the light field camera.
Figure 10:
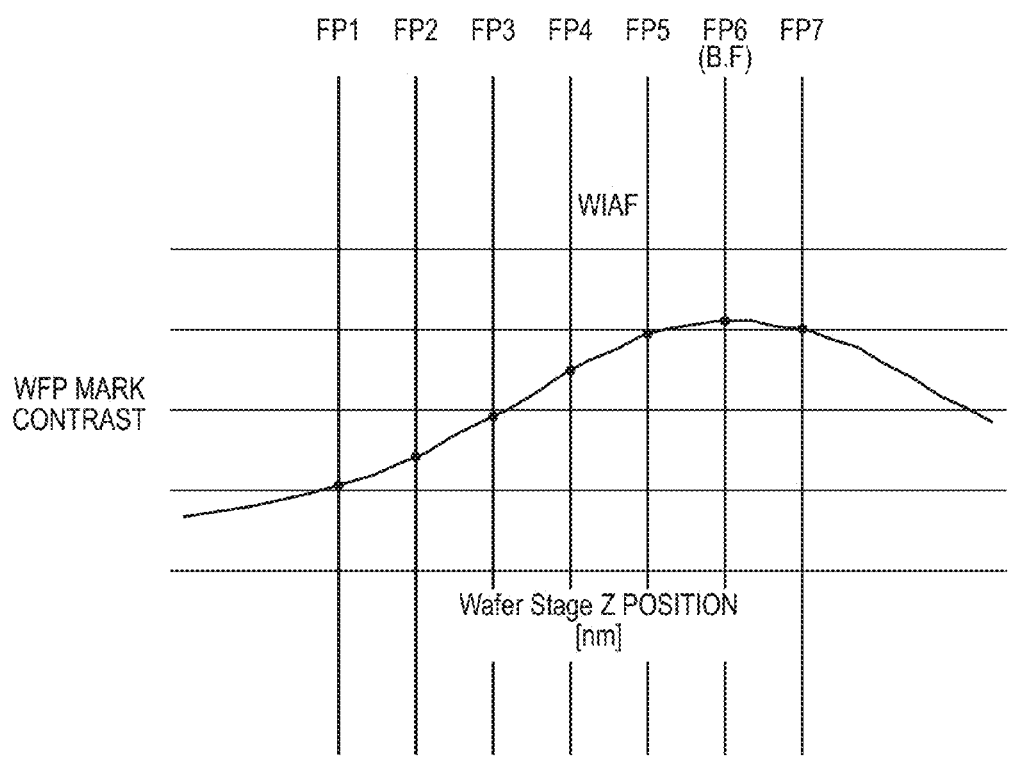
FIG. 10 is a graph exemplifying the relationship between the respective focus planes FPs of the light field camera and the contrast value of the WFP mark.

FP1 to FP7 also correspond to different Z positions near the WFP mark shown in FIG. 9 simultaneously. Therefore, the WIAF contrast curve, as shown in FIG. 10, with respect to the respective FP positions near the WFP mark corresponding to that shown in FIG. 5 obtained when the WSZ position is changed by the step driving method is obtained by the contrast value of the image of the WFP mark calculated in step S103.

Figure 11:
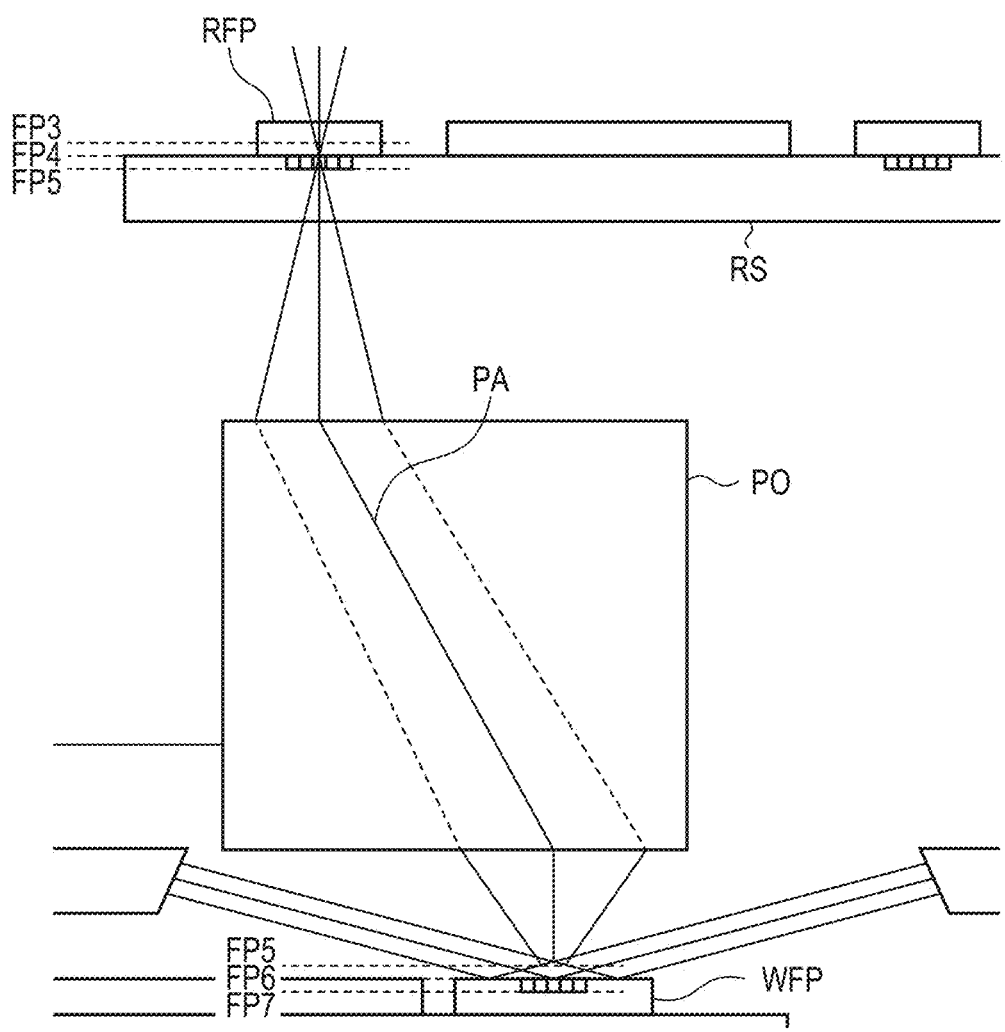
FIG. 11 is a view showing the relationship between the RFP mark, the WFP mark, and the respective focus planes FPs.

FIG. 11 shows the relationship between the RFP mark, the WFP mark, and the respective FP positions anew. The RFP mark and the WFP mark are in the almost conjugate positional relationship, and thus both the peaks of the contrast curves of the RIAF and WIAF exist in the range of FP1 to FP7.

In step S104, the controller CTR calculates the peak positions of the contrast curves of the RIAF and WIAF. If the focus lens position and the WSZ position are not at positions where the focus positions of the RFP mark and WFP mark are not conjugate to each other completely, the peak positions of the contrast curves of the RIAF and WIAF calculated from the FP images of FP1 to FP7 are different.

In step S105, the controller CTR determines the focus lens position, and calculates a difference in peak position between the RIAF contrast curve and the WIAF contrast curve. This difference corresponds to the adjustment amount of the WSZ position that brings the projection optical system PO into best focus when the best focus position of the RFP mark is used as the reference. This allows the controller CTR to adjust, based on this difference, the WSZ position (that is, the position of the substrate holder in the optical axis direction of the projection optical system).

According to this embodiment, it is possible to obtain refocusable light field image data and to calibrate, by calculation processing, the origin of the focus detecting system FS to the best focus position of the projection optical system PO. Therefore, according to this embodiment, it becomes unnecessary to perform step driving of the focus lens and wafer stage WS as before in order to determine the adjustment amount.

In this embodiment, the number of FP positions is seven. However, the number of FP positions is not limited to this value, and any number of FP positions may be used as long as they can be reconstructed by the light field camera. The shapes of the RFP marks and WFP mark are not limited to this arrangement (example of FIG. 3) either as long as a contrast can be calculated. Further, the RFP mark is not limited to a mark on a reticle reference-side plate, and if a mark exists on the reticle RT, that mark may be used. Furthermore, the WFP mark is not limited to a mark on a wafer reference-side plate, and if a mark exists on the wafer WF, that mark may be used.

<Second Embodimen>

Figure 12:
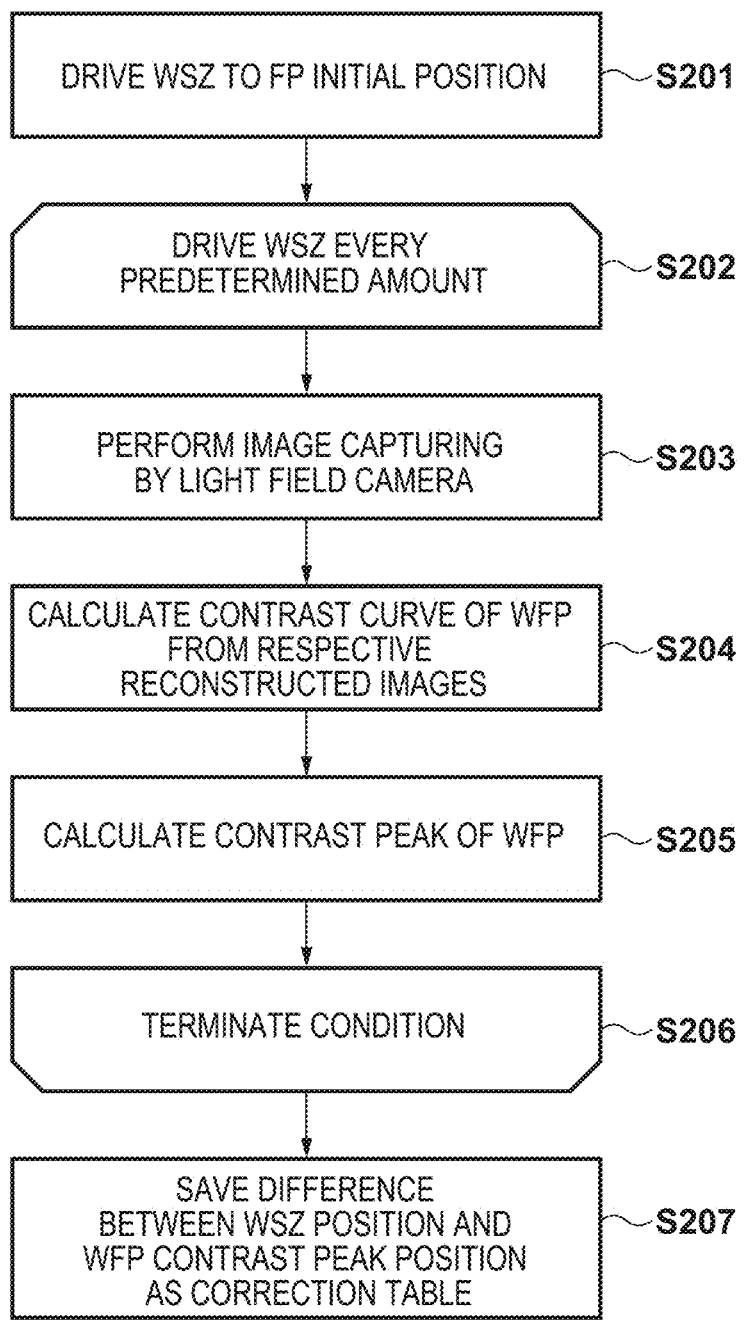
FIG. 12 is a flowchart showing a procedure for creating a correction table of a contrast curve of an image of an RFP mark according to an embodiment.
Figure 13:
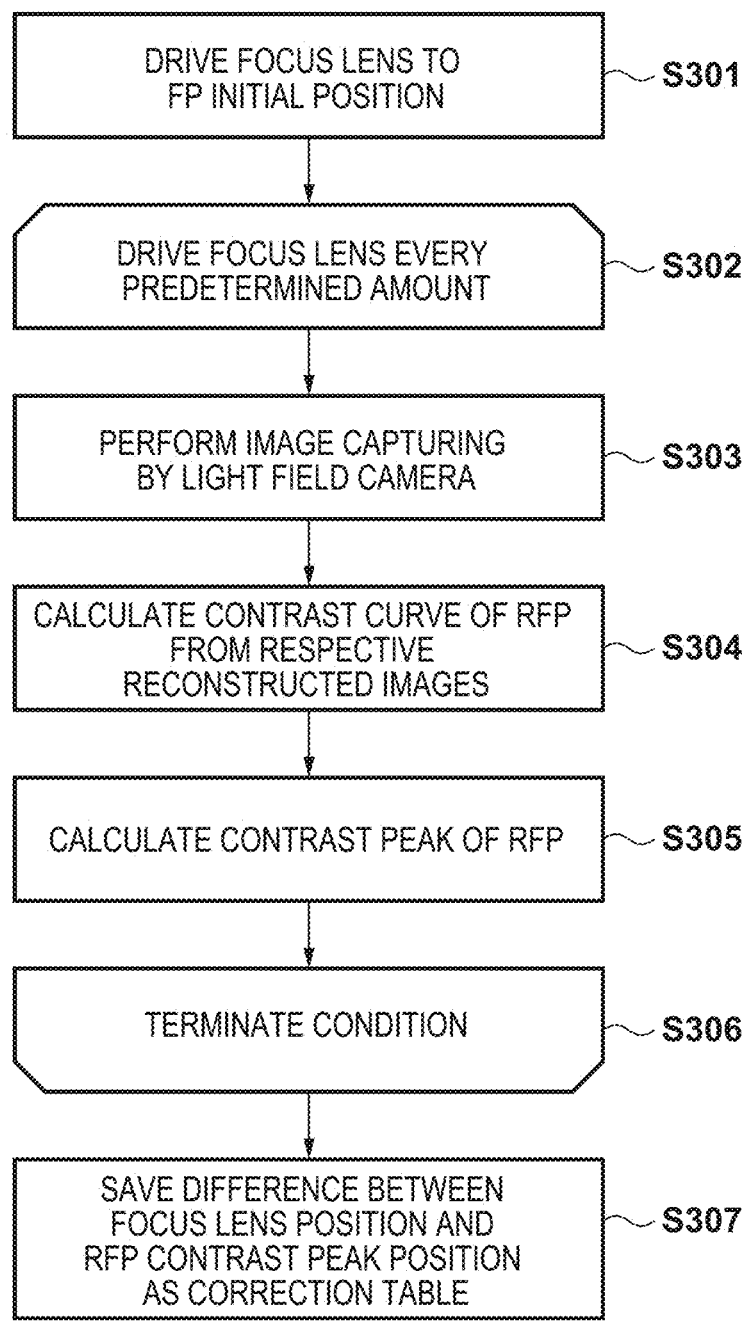
FIG. 13 is a flowchart showing a procedure for creating a correction table of a contrast curve of an image of a WFP mark according to the embodiment.

A method that includes correction of the peak position of a contrast curve will be described below. In this embodiment, following flowcharts shown in FIGS. 12 and 13, a correction table of a contrast curve of a WFP mark and a correction table of a contrast curve of an RFP mark are created. A controller CTR performs this process. More specifically, programs corresponding to the flowcharts of FIGS. 12 and 13 are stored in a memory 12 and executed by a CPU 11.

First, a method of creating the correction table of the contrast curve of an image of the WFP mark will be described. First, in step S201, the controller CTR drives a WSZ position to the position of FP1. In step S203, a light field camera captures the WFP mark, obtaining original image data. In step S204, the controller CTR reconstructs respective FP images by a refocus operation, calculates a contrast value of the image of the WFP mark, and obtains a WIAF contrast curve. In step S205, the controller CTR calculates the peak position of the WIAF contrast curve.

Figure 16:
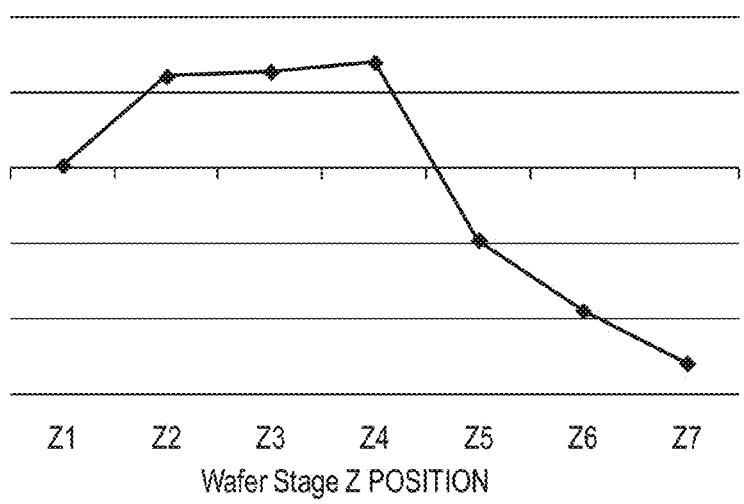
FIG. 16 is a graph showing a difference between the WSZ positions and an FP position for each WSZ position.

Steps S202 to S206 are performed repeatedly while driving WSZ positions from Z1 to Z7 by a predetermined amount. FIG. 14 shows an example of each contrast curve at a corresponding one of the WSZ positions thus obtained. The peak positions of the contrast curves on FPs are calculated from the respective contrast curves, making it possible to obtain the relationship between the WSZ positions (Z1 to Z7) and the peak positions of the contrast curves of the WFP mark. FIG. 15 shows that result. Referring to FIG. 15, the abscissa indicates the WSZ positions (Z1 to Z7), and the ordinate indicates the peak position of the contrast curve from a graph of FIG. 14. This indicates a characteristic that represents dependence of the peak position on the contrast curve of the image of the WFP mark on the position of a substrate holder in an optical axis direction of a projection optical system. As shown in FIG. 15, this characteristic basically has a linear shape. However, the FP image reconstructed on each FP of the light field camera may contain a nonlinear characteristic under the influence of the aberration of a microlens in the light field camera. Therefore, in step S207, the controller CTR calculates a difference (error) between the WSZ positions and the peak positions on the contrast curve of the WFP mark obtained from the relationship of FIG. 15. As a result, a nonlinear residue as shown in FIG. 16 occurs. The controller CTR saves, in the memory 12, information on this error as the correction table of the contrast curve of the WFP mark. A method of using the correction table will be described later with reference to FIG. 19.

A method of creating the correction table of the contrast curve of the RFP mark will now be described. First, in step S301, the controller CTR drives a focus lens LA to the position of FP1. In step S303, the light field camera captures the RFP mark, obtaining original image data. In step S304, the controller CTR reconstructs respective FP images by a refocus operation, calculates a contrast value of the image of the RFP mark, and obtains an RIAF contrast curve. In step S305, the controller CTR calculates the peak position of the RIAF contrast curve.

Figure 17:
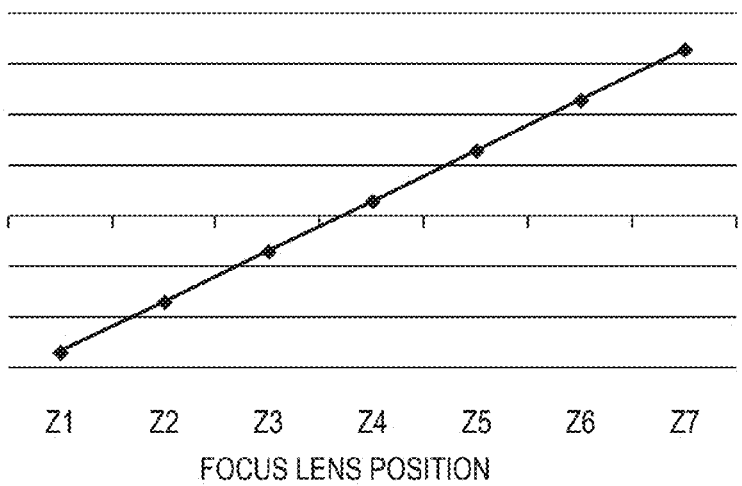
FIG. 17 is a graph showing the relationship between focus lens positions and the peak positions on the contrast curve of the image of the RFP mark.
Figure 18:
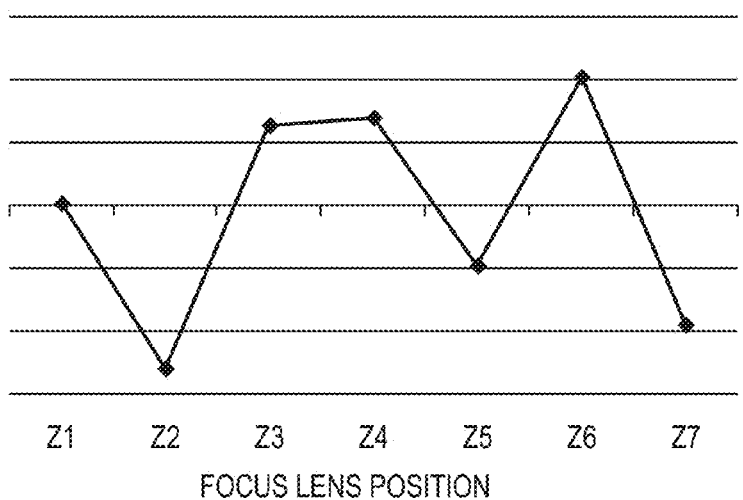
FIG. 18 is a graph showing a difference between the focus lens positions and the FP position for each focus lens position.

Steps S302 to S306 are performed repeatedly while driving the position of the focus lens LA from Z1 to Z7 by a predetermined amount. Respective contrast curves at the respective focus lens positions thus obtained are the same as in FIG. 14. The contrast peak positions on the FPs are calculated from the respective contrast curves, making it possible to obtain the relationship between the focus lens positions (Z1 to Z7) and the peak positions of the contrast curves of the RFP mark. FIG. 17 shows that result. This indicates a characteristic that represents dependence of the peak position on the contrast curve of the image of the RFP mark on the position of the focus lens LA in an optical axis direction of a light detector DT. Then, in step S307, the controller CTR calculates a difference (error) between the focus lens positions and the peak positions on the contrast curve of the RFP mark obtained from the relationship of FIG. 17. As a result, as in FIG. 16, a nonlinear residue as shown in FIG. 18 occurs. The controller CTR saves, in the memory 12, information on this error as the correction table of the contrast curve of the RFP mark.

The correction tables of the contrast curves created in steps S207 and S307 correspond to errors from reference positions of the respective FP positions when viewed with reference to the WSZ positions and focus lens positions capable of accurate positioning. That is, it becomes possible, by obtaining in advance the differences from the references of the WSZ positions and focus lens positions as the correction tables of the contrast curves, to correct the position of each FP that contains the nonlinear characteristic to an accurate reference position. Note that when the correction tables of the contrast curves are created, the influence of a vibration in WS or focus lens, or a driving error may occur. However, it is possible, by performing image capturing or driving a plurality of times and using the average value of outputs, to create the correction tables while reducing the influence of the above-described error to an extent that can be ignored.

Figure 19:
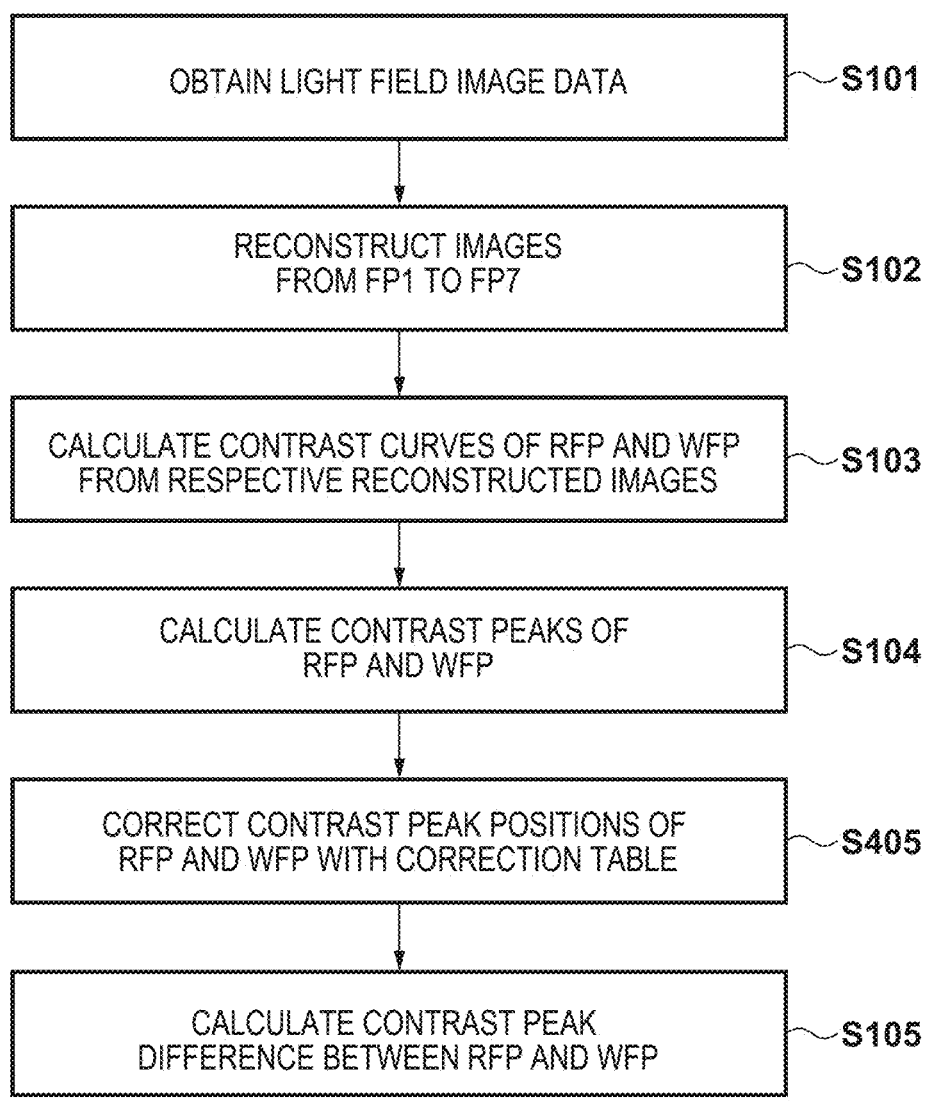
FIG. 19 is a flowchart showing best focus calibration processing of a projection optical system that includes a step of correcting the peak position of the contrast curve according to the embodiment.

FIG. 19 shows a flowchart of best focus calibration processing of the projection optical system by using the correction tables created by the above-described process. The same reference numerals denote the same processing steps as in the flowchart of FIG. 6, and a description thereof will be omitted. A difference from FIG. 6 is that step S405 is added between steps S104 and S105. In step S405, the controller CTR corrects the peak positions of the WIAF contrast curve calculated in step S104 by using the correction table of the contrast curve created in step S207. Consequently, the adjustment amount of the WSZ position obtained in step S105 is corrected (first correction processing). Further, the controller CTR corrects the peak positions of the RIAF contrast curve calculated in step S104 by using the correction table of the contrast curve created in step S307. Consequently, the focus lens position determined in step S105 is corrected (second correction processing).

By adding the above correction, it is possible to match the accuracies of a plurality of images reconstructed by the refocus operation with the accuracy of a focus detecting system FS, and to prevent a decrease in calibration accuracy of the best focus position.

<Third Embodiment>

A range that can be refocused by a light field camera will be referred to as a refocus range ("FP range" hereinafter). In general, the FP range of the light field camera is limited to a width depending on the specifications of a shooting lens L1 and micro lens array L2. Thus, if the change amount of the best focus position of a projection optical system PO exceeds the FP range, the contrast peak does not exist in each FP image of the light field camera, making it impossible to calculate the peak position of a contrast curve.

To cope with this, the third embodiment adds a process of guaranteeing that the peak position of the contrast curve of each mark is positioned within the FP range. First, at the time of first measurement, the peak position of the contrast curve is calculated from the light field camera according to the first embodiment described above. If the peak position of the contrast curve does not fall within the FP range at the start, an initial position where the peak position of the contrast curve falls within the FP range is searched by scanning a WSZ position and a focus lens position. Then, a difference between a position in the middle of the FP range and the peak position of the contrast curve determined as the initial position by this search is calculated, and this is reflected in the WSZ position and focus lens position at the time of next measurement.

This makes it possible to set a contrast peak position at the time of next measurement to a focus plane position in the middle of the FP range. According to this embodiment, it is possible to prevent the best focus position from falling outside the FP range in a case in which, for example, the best focus position of the projection optical system PO drifts moderately.

<Fourth Embodiment>

Figure 20:
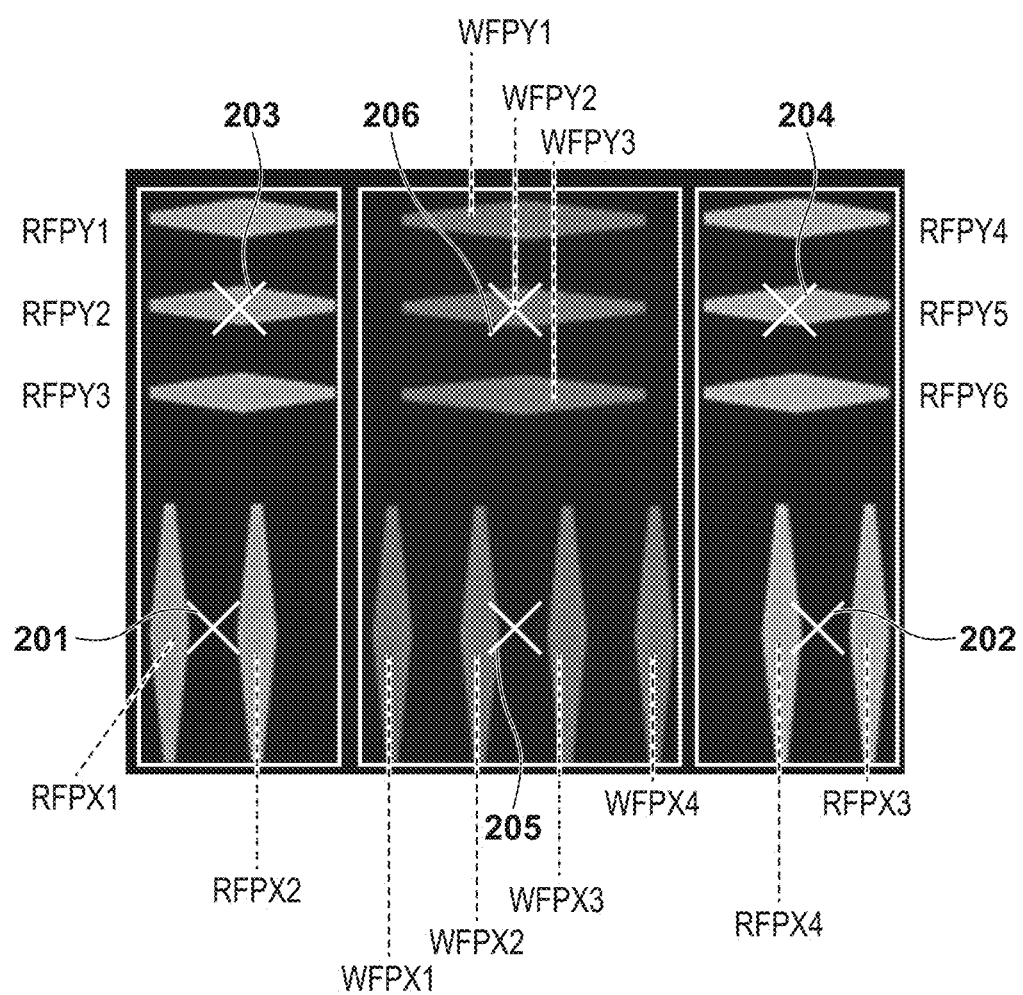
FIG. 20 is a view exemplifying RFP marks and WFP marks according to an embodiment.

In the fourth embodiment, a method of calibrating an X-Y position will be described in addition to calibration of the best focus position of a projection optical system PO. The arrangement of an exposure apparatus of this embodiment is approximately the same as in FIG. 1. However, RFP marks and WFP marks each having a shape as shown in, for example, FIG. 20 are used. The RFP marks include marks RFPX1 to RFPX4 for X-position measurement and focus measurement, and marks RFPY1 to RFPY6 for Y-position measurement and focus measurement. The WFP marks include marks WFPX1 to WFPX4 for X-position measurement and focus measurement, and marks WFPY1 to WFPY3 for Y-position measurement and focus measurement. This makes it possible to calculate, from an FP image, the X-Y position of each mark in addition to the contrast of the respective marks. More specifically, the average values of positions on images of the marks RFPX1 to RFPX4 are calculated as RFP mark X positions 201 and 202, and the average values of positions on images of the marks RFPY1 to RFPY6 are calculated as RFP mark Y positions 203 and 204. Further, the average value of positions on images of WFPX1 to WFPX4 is calculated as a WFP mark X position 205, and the average value of positions on images of WFPY1 to WFPY3 is calculated as a WFP mark Y position 206. A general pattern matching method such as correlation calculation of a mark pattern can be used to calculate the X-Y position of the mark. However, the present invention is not limited to a specific method as long as an object is accomplished. A mark shape is not limited to a specific shape either.

Figure 21:
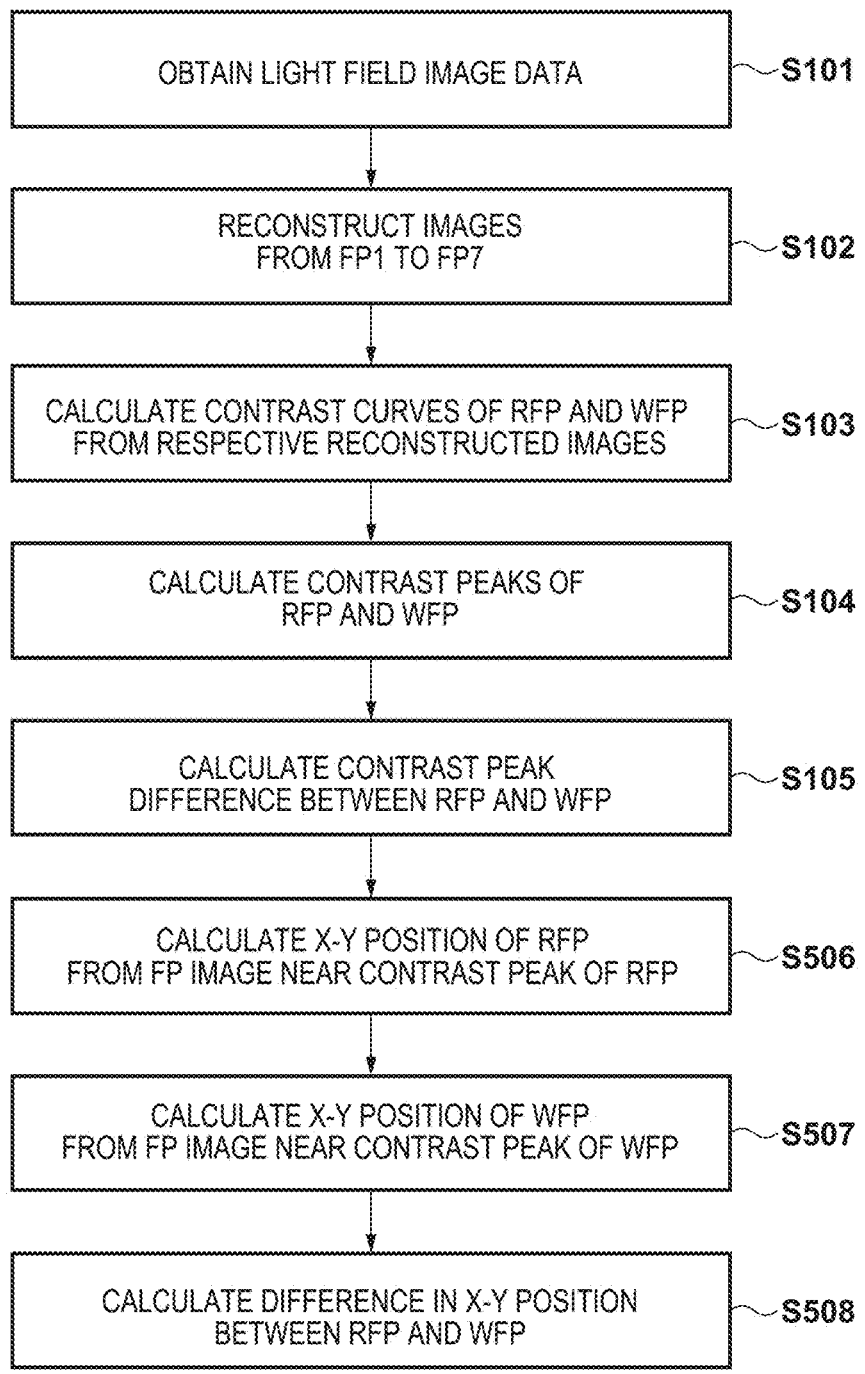
FIG. 21 is a flowchart showing calibration processing of the best focus of a projection optical system and an X-Y position according to the embodiment.

A method of calibrating the X-Y position and the best focus position of the projection optical system PO will be described below with reference to a flowchart of FIG. 21. First, respective steps S101 to S105 as in FIG. 6 are performed. Then, in step S506, a controller CTR detects the X-Y position (first position) of the RFP mark from an FP image corresponding to the peak position (for example, the FP image near the peak position) on a contrast curve of an image of the RFP mark. In step S507, the controller CTR detects the X-Y position (second position) of the WFP mark from an FP image corresponding to the peak position (for example, the FP image near the peak position) on a contrast curve of an image of the WFP mark. In step S508, the controller CTR calculates a difference in X-Y position between the RFP mark and the WFP mark. This difference in X-Y position becomes the X-Y position of the WFP mark when the RFP mark is used as a reference, and this corresponds to the X-Y position of the projection optical system PO when the RFP mark is used as the reference. It is therefore possible, based on the difference in X-Y position, to determine the adjustment amount of the position of at least one of an original holder and substrate holder on the X-Y plane. This makes it possible, by perform calibration so as to make this difference in X-Y position constant, to calibrate the X-Y position of the projection optical system PO simultaneously with calibration of the best focus position.

<Fifth Embodiment>

An embodiment will be described below in which the above-described first correction processing and second correction processing are performed on each position on a plane (X-Y plane) perpendicular to the direction of an optical axis PA. A point different from that in the fourth embodiment will be described below with reference to flowcharts of FIGS. 22 and 23.

Figure 22:
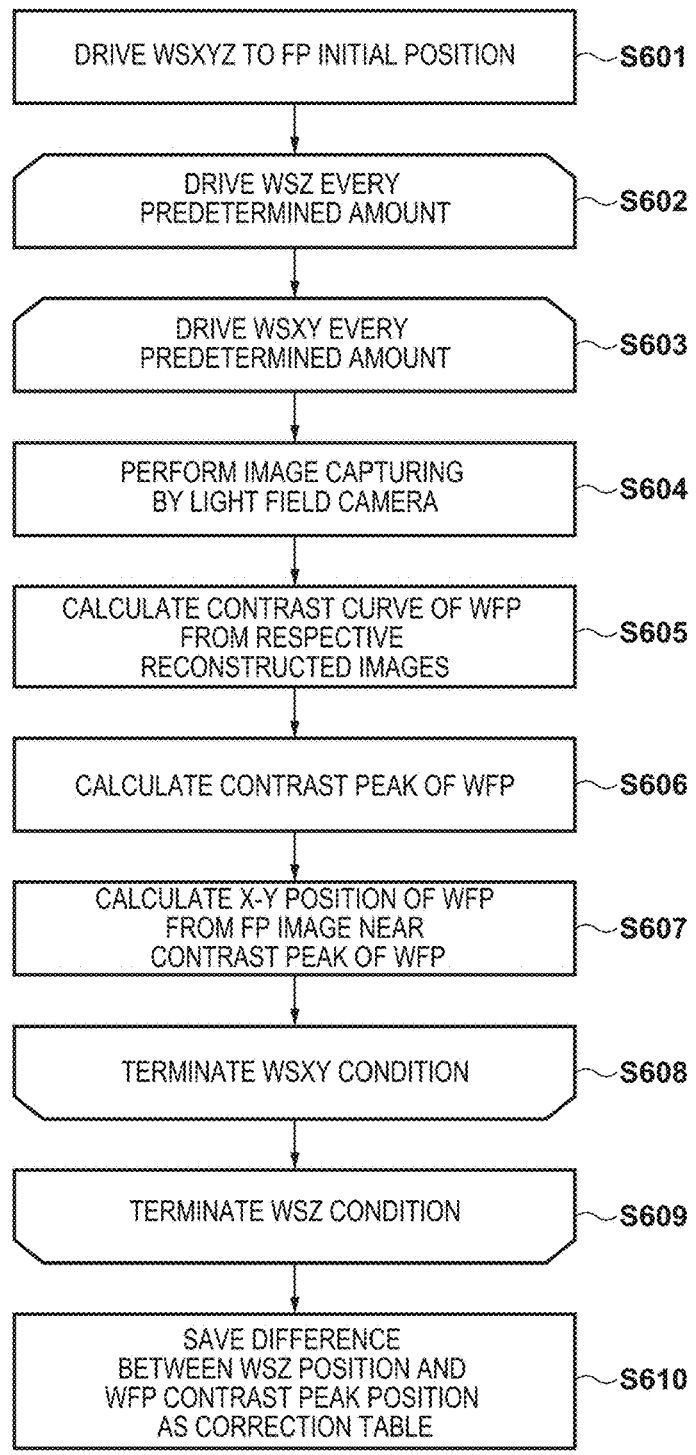
FIG. 22 is a flowchart showing a procedure for creating a correction table of a contrast curve of an image of an RFP mark and a correction table of an X-Y position according to an embodiment.
Figure 23:
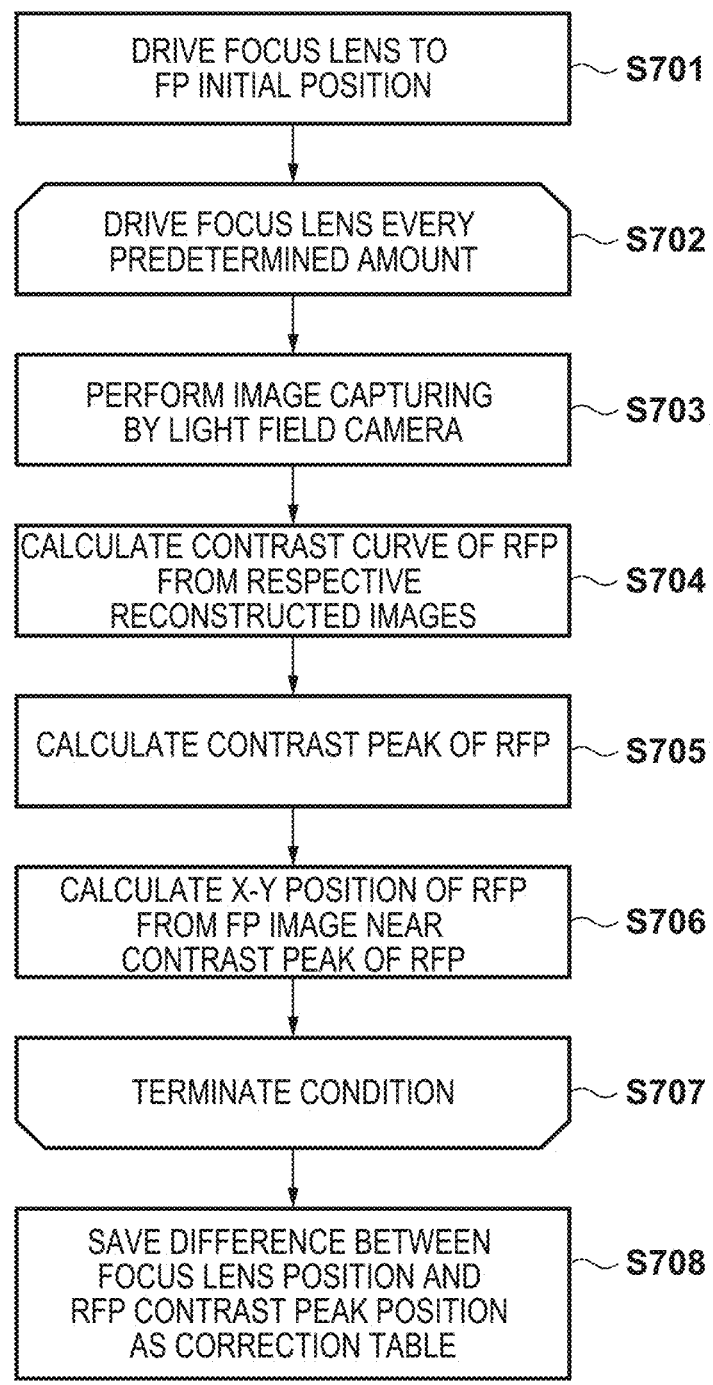
FIG. 23 is a flowchart showing a procedure for creating a correction table of a contrast curve of an image of a WFP mark and the correction table of the X-Y position according to the embodiment.

In this embodiment, a contrast curve of an image of a WFP mark and an X-Y position correction table, and a contrast curve of an image of an RFP mark and an X-Y position correction table are created by procedures shown in the flowcharts of FIGS. 22 and 23.

First, in step S601, a controller CTR drives a WSZ position to the position of FP1 as an initial position and drives an X-Y position of a wafer stage WS (to be referred to as a "WSXY position" hereinafter) to the center of the field of a light field camera. In step S604, the controller CTR causes the light field camera to capture the WFP mark, obtaining original image data. In step S605, the controller CTR reconstructs respective FP images to calculate a contrast value of the image of the WFP mark, obtaining a WIAF contrast curve. In step S606, the controller CTR calculates the peak position of the WIAF contrast curve. In step S607, the controller CTR calculates the X-Y position of the WFP mark from an FP image near the peak of the contrast curve of the WFP mark. Steps S602 to S609 are performed while moving the WSZ position (step S602) and the WSXY position (step S603).

Then, in step S610, the controller CTR calculates a difference in relationship between the WSZ position and the peak position of the contrast curve calculated at the respective FP positions, and a difference in relationship between the WSXY position and the X-Y position of the WFP mark at the peak position of each contrast curve. These are saved in a memory 12 as correction tables. A method of using the correction tables will be described later with reference to FIG. 24.

A method of creating a correction table of the RFP mark will now be described. First, in step S701, the controller CTR drives a focus lens LA to the position of FP1 as an initial position. In step S703, the controller CTR causes the light field camera to capture the RFP mark, obtaining original image data. In step S704, the controller CTR reconstructs the respective FP images to calculate a contrast value of the image of the RFP mark, obtaining an RIAF contrast curve. In step S705, the controller CTR calculates the peak position of the RIAF contrast curve. In step S706, the controller CTR calculates the X-Y position of the RFP mark from an FP image near the peak of the contrast curve of the RFP mark. Steps S702 to S707 are performed while moving the focus lens position (step S702).

Then, in step S708, the controller CTR calculates a difference in relationship between the focus lens position and the peak position of the contrast curve calculated at the respective FP positions, and a difference between an FPO position and the X-Y position of the RFP mark at the peak position of each contrast curve. These are saved in the memory 12 as correction tables.

Note that the FP images used in steps S607 and S706 are not limited to the images near the peaks of the contrast curves. An FP image at the peak position of a contrast curve between the FP positions may be used by estimating it by linear interpolation, polynomial approximation, or the like of a vicinity image. The correction tables created in steps S610 and S707 correspond to an error from an ideal position at each FP position and a distortion error at each FP position relative to an ideal grid formed with the WSXY position of reference when viewed with reference to the WSZ position and focus lens position capable of accurate positioning. Note that each correction table calculates an arbitrary value by linear interpolation, polynomial approximation, or the like of a vicinity value and uses the calculated value. Note that when the correction tables are created, the influence of a vibration in WS or focus lens, or a driving error may occur. However, it is possible, by performing image capturing or driving a plurality of times and using the average value of outputs, to create the correction tables while reducing the influence of the above-described error to an extent that can be ignored.

Figure 24:
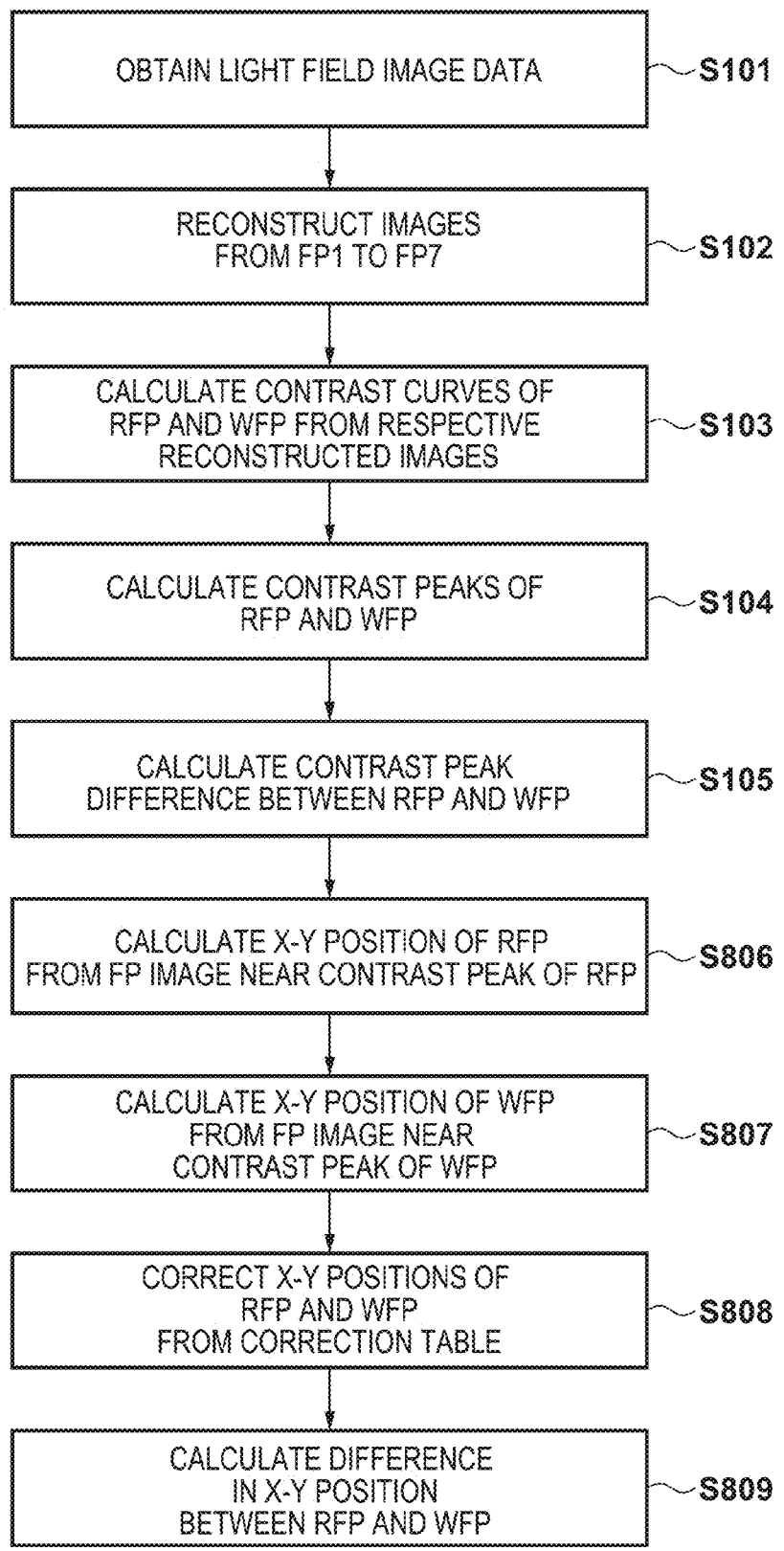
FIG. 24 is a flowchart showing best focus calibration processing of a projection optical system and an X-Y position calibration processing according to the embodiment.

FIG. 24 shows a flowchart of best focus calibration processing of a projection optical system by using the correction tables created by the above-described process. First, processing in steps S101 to S105 as in FIG. 6 is performed. Subsequently, in step S806, the controller CTR calculates the X-Y position of the RFP mark from an FP image near the peak on the contrast curve of the image of the RFP mark. In step S807, the controller CTR calculates the X-Y position of the WFP mark from an FP image near the peak on the contrast curve of the image of the WFP mark. In step S809, the controller CTR corrects the X-Y position of the RFP mark and the X-Y position of the WFP mark to the WSXY position of reference by the correction tables created in steps S610 and S708. Then, in step S810, the controller CTR calculates a difference in X-Y position between the RFP mark and the WFP mark, and terminates measurement.

<Sixth Embodiment>

In the sixth embodiment, a method of guaranteeing that a contrast curve of each mark is positioned in an FP range and guaranteeing that each mark is positioned in the field of a light field camera will be described. A method of guaranteeing a focus position is the same as in the third embodiment, and thus a method of guaranteeing an X-Y position will be described here.

An X-Y measurement range of each mark that can be measured by the light field camera is limited within the observation field of the light field camera. Therefore, if the change amount of an X-Y position of a projection optical system PO exceeds the above-described field range, the X-Y position of the mark cannot be measured from each FP image of the light field camera.

Therefore, this embodiment avoids this problem by adding the following process. First, at the time of first measurement, a mark X-Y position is calculated from the light field camera according to the above-described fourth embodiment. If the mark is not in the observation field at the start, an initial position at which the X-Y position of the mark falls within the observation field is searched and determined by scanning a WSXY position. A difference between the mark X-Y position calculated from the light field camera and a position in the center of the observation field is calculated, and reflected in the WSXY position at the time of next measurement.

This makes it possible to set a mark X-Y position to be measured next by the light field camera to the center of the observation field. According to this embodiment, it is possible to prevent the X-Y position of the mark from falling outside the observation field in a case in which, for example, the X-Y position of the projection optical system PO drifts moderately.

The exposure apparatus as an example of the lithography apparatus has been described in the above-described embodiments. However, the present invention is applicable not only to the exposure apparatus but also to another lithography apparatus (an imprint apparatus, a charge-particle beam drawing apparatus, or the like). Note that the imprint apparatus is an apparatus which forms a pattern on a substrate by curing an imprint material supplied onto the substrate in a state in which a mold (an original or a template) is brought into contact with the imprint material. The charge-particle beam drawing apparatus is an apparatus which forms a latent image in a photoresist supplied onto the substrate by drawing a pattern with a charge-particle beam in the photoresist.

<Embodiment of Article Manufacturing Method>

An article manufacturing method according to an embodiment of the present invention is suitable for manufacturing an article, for example, a microdevice such as a semiconductor device or an element having a microstructure. The article manufacturing method according to this embodiment includes a step of transferring the pattern of an original onto a substrate using the above-described lithography apparatus (an exposure apparatus, an imprint apparatus, a drawing apparatus, or the like), and a step of processing the substrate onto which the pattern has been transferred in the preceding step. This manufacturing method further includes other known steps (oxidation, deposition, vapor deposition, doping, planarization, etching, resist removal, dicing, bonding, packaging, and the like). The article manufacturing method according to this embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-205470, filed Oct. 19, 2016, which is hereby incorporated by reference herein in its entirety.

What is claimed is:

1. A lithography apparatus which includes a projection optical system that projects a pattern of an original on a substrate, the apparatus comprising:
an original holder that holds the original;
a substrate holder that holds the substrate;
a detector that detects an original-side mark image arranged in one of the original and the original holder, and a substrate-side mark image arranged in one of the substrate and the substrate holder via the projection optical system; and
a controller,
wherein the detector generates refocusable light field image data that includes the original-side mark image and the substrate-side mark image, and
wherein the controller
performs, based on the light field image data obtained from the detector, a refocus operation of reconstructing a plurality of images, and
adjusts a position of at least one of the original holder and the substrate holder in a first direction parallel to an optical axis of the projection optical system based on a difference between a peak position on a contrast curve obtained from a contrast value of the original-side mark image in each of the plurality of images and a peak position on a contrast curve obtained from a contrast value of the substrate-side mark image in each of the plurality of images.

2. The apparatus according to claim 1, wherein the controller adjusts a position of the substrate holder in the first direction based on the difference.

3. The apparatus according to claim 1, wherein the detector includes a focus lens, and
the controller
determines a position of the focus lens in the first direction in accordance with the peak position on the contrast curve of the original-side mark image, and
based on the difference, determines an adjustment amount of the position of the substrate holder in the first direction with reference to the determined position of the focus lens.

4. The apparatus according to claim 3, further comprising a focus detecting system that irradiates, with light, a surface of the substrate in an oblique direction with respect to the optical axis of the projection optical system and detects a position of the substrate in the first direction by detecting light reflected by the surface of the substrate.

5. The apparatus according to claim 4, wherein based on information on an error at a peak position on the contrast curve of the substrate-side mark image with respect to the position of the substrate holder in the first direction detected by the focus detecting system in a characteristic representing dependence of the peak position on the position of the substrate holder in the first direction, the controller performs first correction processing of correcting the determined adjustment amount of the substrate holder.

6. The apparatus according to claim 5, wherein the controller drives the substrate holder to each position in the first direction and causes the detector to reconstruct the light field image data at each position, obtaining the characteristic.

7. The apparatus according to claim 4, wherein based on information on an error at a peak position on the contrast curve of the original-side mark image with respect to the position of the substrate holder in the first direction detected by the focus detecting system in a characteristic representing dependence of the peak position on the position of the focus lens in the first direction, the controller performs second correction processing of correcting the determined position of the focus lens.

8. The apparatus according to claim 7, wherein the controller drives the focus lens to each position in the first direction and causes the detector to reconstruct the light field image data at each position, obtaining the characteristic.

9. The apparatus according to claim 3, wherein the controller determines the position of the focus lens in the first direction such that the peak position on the contrast curve of the original-side mark image becomes a focus plane position in a middle of a refocus range indicating a range that can be refocused by the light field image data.

10. The apparatus according to claim 3, wherein the controller determines the adjustment amount of the position of the substrate holder in the first direction such that the peak position on the contrast curve of the substrate-side mark image becomes a focus plane position in a middle of a refocus range indicating a range that can be refocused by the light field image data.

11. The apparatus according to claim 4, wherein the controller further
detects a first position indicating a position on a plane perpendicular to the first direction of the original-side mark image from an image, out of the plurality of images, corresponding to the peak position on the contrast curve of the original-side mark image,
detects a second position indicating a position on the plane of the substrate-side mark image from an image, out of the plurality of images, corresponding to the peak position on the contrast curve of the substrate-side mark image, and
based on a difference between the first position and the second position, determines an adjustment amount of the position of at least one of the original holder and the substrate holder on the plane.

12. The apparatus according to claim 11, wherein based on information on an error at a peak position on the contrast curve of the substrate-side mark image with respect to the position of the substrate holder in the first direction detected by the focus detecting system in a characteristic representing dependence of the peak position on the position of the substrate holder in the first direction, the controller performs first correction processing of correcting the determined adjustment amount of the substrate holder on each position of the plane perpendicular to the first direction.

13. The apparatus according to claim 11, wherein based on information on an error at a peak position on the contrast curve of the original-side mark image with respect to the position of the substrate in the first direction detected by the focus detecting system in a characteristic representing dependence of the peak position on the position of the focus lens in the first direction, the controller performs second correction processing of correcting the determined position of the focus lens on each position of the plane perpendicular to the first direction.

14. An article manufacturing method of manufacturing an article, the method comprising:
forming a pattern on a substrate using a lithography apparatus; and
processing the substrate on which the pattern has been formed in the forming,
wherein the article is manufactured using the substrate processed in the processing,
and wherein a lithography apparatus includes a projection optical system that projects a pattern of an original on a substrate, the apparatus comprising:
an original holder that holds the original;
a substrate holder that holds the substrate;
a detector that detects an original-side mark image arranged in one of the original and the original holder, and a substrate-side mark image arranged in one of the substrate and the substrate holder via the projection optical system; and
a controller,
wherein the detector generates refocusable light field image data that includes the original-side mark image and the substrate-side mark image, and
wherein the controller
performs, based on the light field image data obtained from the detector, a refocus operation of reconstructing a plurality of images, and
adjusts a position of at least one of the original holder and the substrate holder in a first direction parallel to an optical axis of the prosection optical system based on a difference between a peak position on a contrast curve obtained from a contrast value of the original-side mark image in each of the plurality of images and a peak position on a contrast curve obtained from a contrast value of the substrate-side mark image in each of the plurality of images.

* * * * *